(12) United States Patent
Nishikawa (10) Patent No.: US 10,230,495 B2
(45) Date of Patent: Mar. 12, 2019

(54) CRC CALCULATION CIRCUIT, SEMICONDUCTOR DEVICE, AND RADAR SYSTEM

(71) Applicant: Renesas Electronics Corporation, Tokyo (JP)

(72) Inventor: Takuro Nishikawa, Tokyo (JP)

(73) Assignee: Renesas Electronics Corporation, Koutou-ku, Tokyo (JP)

(*) Notice: Subject to any disclaimer, the term of this patent is extended or adjusted under 35 U.S.C. 154(b) by 0 days.

(21) Appl. No.: 15/622,701

(22) Filed: Jun. 14, 2017

(65) Prior Publication Data

US 2018/0041308 A1 Feb. 8, 2018

(30) Foreign Application Priority Data

Aug. 3, 2016 (JP) .................................. 2016-152673

(51) Int. Cl.
| | | |
|---|---|---|
| G06F 11/10 | (2006.01) | |
| H03M 13/00 | (2006.01) | |
| H04L 1/00 | (2006.01) | |
| H03M 13/15 | (2006.01) | |
| H04B 1/40 | (2015.01) | |
| H03M 13/09 | (2006.01) | |

(52) U.S. Cl.
CPC ........ *H04L 1/0061* (2013.01); *H03M 13/091* (2013.01); *H03M 13/157* (2013.01); *H03M 13/6522* (2013.01); *H04B 1/40* (2013.01)

(58) Field of Classification Search
CPC .. H03M 13/157; H03M 13/6522; H04B 1/40; H04L 1/0061
See application file for complete search history.

(56) References Cited

U.S. PATENT DOCUMENTS 6,820,228 B1* 11/2004 Keller ................. H03M 13/091
714/757
2002/0053015 A1* 5/2002 Tan ...................... G06F 9/30029
712/42

FOREIGN PATENT DOCUMENTS

| JP | 7-095096 A | 4/1995 |
|---|---|---|
| JP | 2001-036414 A | 2/2001 |

* cited by examiner

*Primary Examiner* — Samir W Rizk
(74) *Attorney, Agent, or Firm* — Sughrue Mion, PLLC (57) ABSTRACT

Provided is a CRC calculation circuit capable of dealing with various types of generator polynomials with a simple configuration. A CRC calculation circuit (100) includes a generator polynomial register (110) configured to store polynomial data, and a plurality of CRC calculation units (120) connected in series and provided so as to correspond to the number of bits of input data. The CRC calculation units (120) each include a barrel shifter (121) configured to shift calculated data by one bit using the input data or output data from a pre-stage CRC calculation unit as the calculated data; an XOR circuit (122) configured to perform XOR calculation of the shifted data and the polynomial data; and a multiplexer (123) configured to select, based on the calculated data, the shifted data or calculation result data.

16 Claims, 8 Drawing Sheets

CRC CALCULATION CIRCUIT, SEMICONDUCTOR DEVICE, AND RADAR SYSTEM

CROSS-REFERENCE TO RELATED APPLICATIONS

This application is based upon and claims the benefit of priority from Japanese patent application No. 2016-152673, filed on Aug. 3, 2016, the disclosure of which is incorporated herein in its entirety by reference.

BACKGROUND

The present invention relates to a CRC calculation circuit, a semiconductor device, and a radar system. For example, the present invention relates to a CRC calculation circuit, a semiconductor device, and a radar system which perform CRC calculation.

A CRC (Cyclic Redundancy Check) system is widely used as an error detection system for data communication or the like in various systems. In the CRC system, a transmission side and a reception side perform CRC calculation using the same generator polynomial, thereby enabling error detection. The generator polynomial affects the error detection ability. Accordingly, various generator polynomials are employed depending on communication standards and requests from a system.

As related art, for example, Japanese Unexamined Patent Application Publication No. H07-095096 and Japanese Unexamined Patent Application Publication No. 2001-036414 are known.

SUMMARY

In recent years, systems employing the CRC system have been diversified and thus there is a demand for CRC calculation circuits for performing CRC calculation to be compatible with various types of generator polynomials. However, it is difficult for the related art to be compatible with various types of generator polynomials with a simple configuration.

Other problems to be solved by and novel features of the invention will become apparent from the following description and the drawings.

According to one embodiment, a CRC calculation circuit includes a generator polynomial storage unit and a plurality of CRC calculation units. The generator polynomial storage unit stores polynomial data corresponding to a generator polynomial, and the plurality of CRC calculation units are connected in series and provided so as to correspond to the number of bits of input data to be calculated.

The plurality of CRC calculation units each include a barrel shifter, an XOR circuit, and a selection circuit. The barrel shifter shifts calculated data by one bit using the input data or output data from a pre-stage CRC calculation unit as the calculated data. The XOR circuit performs XOR calculation of shifted data shifted by the barrel shifter and the stored polynomial data. The selection circuit selects one of the shifted data and calculation result data obtained as a result of calculation by the XOR circuit, and outputs the selected data.

According to the one embodiment, it is possible to provide a technique for dealing with various types of generator polynomials with a simple configuration.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

The following description and the drawings are abbreviated and simplified as appropriate for clarity of explanation. The elements illustrated in the drawings as functional blocks for performing various processes can be implemented hardwarewise by a CPU, a memory, and other circuits, and softwarewise by a program loaded onto a memory or the like. Accordingly, it is to be understood by those skilled in the art that these functional blocks can be implemented in various forms including, but not limited to, hardware alone, software alone, and a combination of hardware and software. Note that in the drawings, the same elements are denoted by the same reference numerals, and repeated descriptions are omitted as needed.

(Research Leading to Embodiments)

For example, in an on-vehicle radar system including a semiconductor device, a CRC system is used for communication between a radar analog (RF) chip and a microcontroller chip. In such a system, high reliability is required, and thus it is necessary to improve the information reliability of communication between chips. Accordingly, a highly efficient formula is selected as a generator polynomial of a CRC code used for communication of control signals and data between the chips.

Further, the radar system is required to have various performances depending on the type of vehicles, generations, and the like, and it is difficult to predict the required generator polynomial in advance. Thus, since the generator polynomial to be used varies depending on the request of the system or the like, there is a demand for the CRC calculation circuit to deal with a plurality of generator polynomials.

Figure 1:
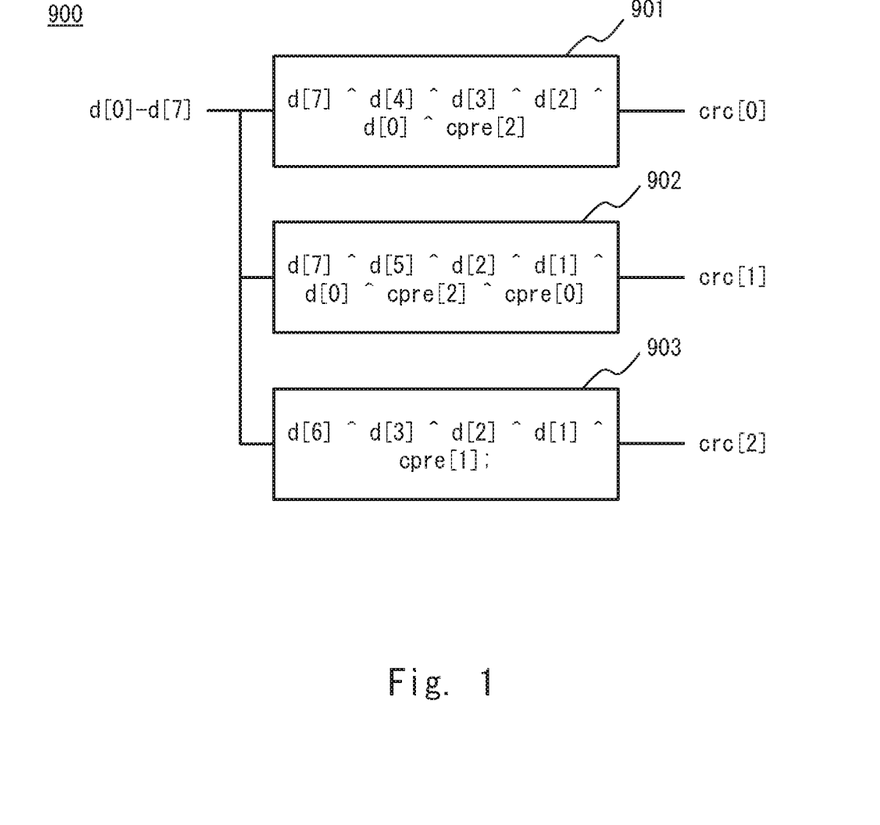
FIG. 1 is a block diagram showing a configuration example of a CRC calculation circuit of Reference Example 1.

As Reference Example 1, an example in which CRC calculation is executed by a circuit fixed to a specific polynomial can be considered. Specifically, in the Reference Example 1, a calculation circuit is configured using a combination of fixed XOR circuits. FIG. 1 shows a configuration image of a CRC calculation circuit of Reference Example 1. A CRC calculation circuit 900 of Reference Example 1 is an example of a case where generator polynomial=$x^3+x+1$, and includes calculation circuits 901 to 903 which are fixed combinational circuits compatible with the generator polynomial. Note that in FIG. 1, "cpre" represents a previous calculation result. In Reference Example 1, the circuit configuration is simple, but a number of circuits corresponding to the number of corresponding generator polynomials are required, which makes it difficult to flexibly deal with various types of generator polynomials, To deal with general-purpose generator polynomials, for example, it is possible to employ a method of causing a CPU to execute a calculation for generator polynomials. However, since the resources and memory space for the CPU are consumed, it is preferable to deal with general-purpose generator polynomials by using hardware so as to prevent adverse effects on the CPU performance.

As examples for dealing with various types of generator polynomials using hardware, a sequential bit calculation system and a look-up table system can be employed. In the sequential bit calculation system, bits are sequentially shifted every one clock signal and performs XOR calculation, which causes a problem that the number of necessary clock signals increases and the processing speed is low.

Figure 2:
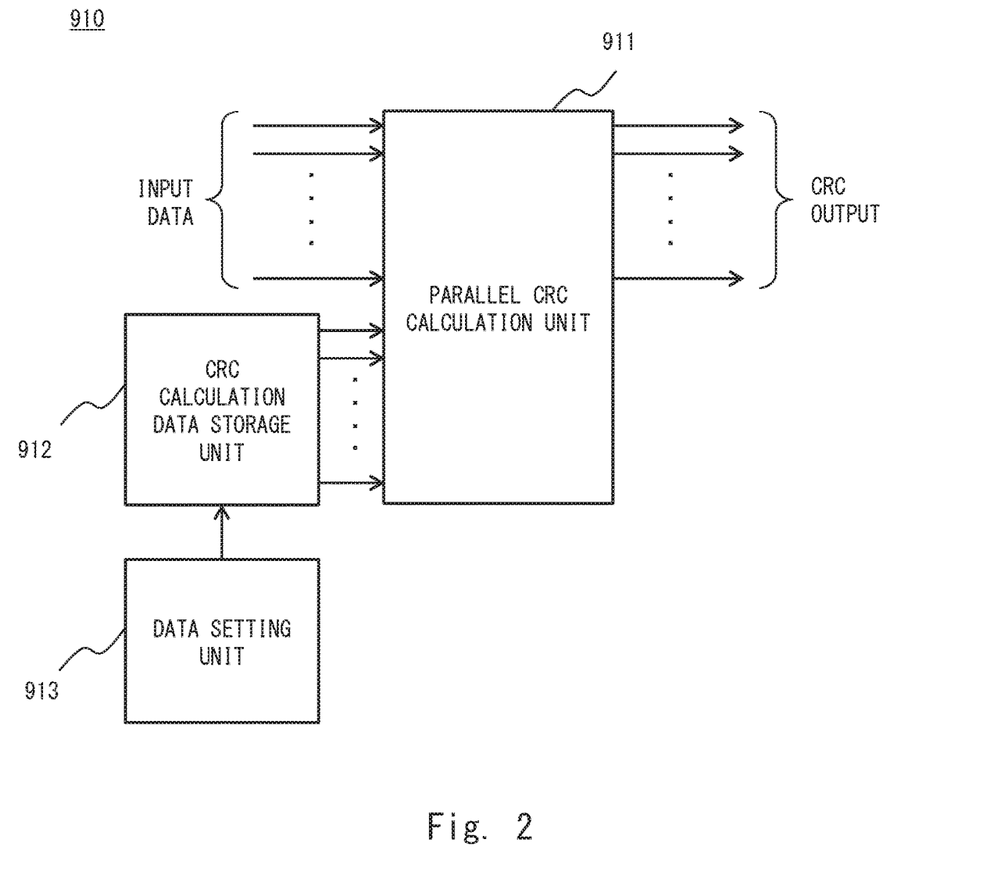
FIG. 2 is a block diagram showing a configuration example of a CRC calculation circuit of Reference Example 2.

FIG. 2 shows a configuration of a CRC calculation circuit of Reference Example 2 disclosed in Japanese Unexamined Patent Application Publication No. H07-095096as an example of the look-up table system. In Reference Example 2, data (look-up table) calculated in advance by a data setting unit 913 is stored in a data storage unit 912, and a parallel CRC calculation unit 911 selects a calculation result from the stored data and input data. Note that the CRC calculation can be performed by the CPU, instead of using the parallel CRC calculation unit, and the use of the look-up table makes it possible to execute the general-purpose and rapid CRC calculation. In Reference Example 2, generator polynomials can be changed by changing the configuration of the data storage unit, or by updating the look-up table in the case of using the CPU.

In the look-up table system of Reference Example 2, the general-purpose and rapid CPC calculation can be implemented. However, when the CPC calculation is implemented using hardware, a generator polynomial is expanded in the data storage unit and the expanded generator polynomial is stored in the look-up table, so that a large number of flip-flops (FFs) are required. Therefore, in order to obtain the CRC calculation result, a logical connection of a combination of a large number of flip-flops is required.

Considering a case where self-diagnosis is performed at the time of shipment of LSIs or at the time of startup, the configuration in which a large number of flip-flops are combined has a problem that a failure detection rate with respect to a SCAN test using a pseudo-random number is low and thus self-diagnosis and failure detection cannot be performed accurately.

In order to ensure high reliability in an on-vehicle system, it is necessary for a self-diagnosis circuit (BIST circuit) to carry out self-diagnosis after startup, and a high failure detection rate and a reduction in initialization time are required. Accordingly, a configuration that enables high-accuracy detection for a short, period of time is required.

However, in the configuration in which the table is held in the data storage unit like in Reference Example 2, it is difficult to achieve a rapid detection.

Note that in the look-up table system, it is necessary to replace all tables when generator polynomials are changed. In the look-up table system., since a number of clock signals corresponding to the number of tables are required to generate tables, which takes a lot of time for switching generator polynomials. Further, in the look-up table system, a large number of flip-flops are required, which leads to an increase in the circuit area.

Therefore, according to an embodiment of the invention, it is possible to provide a general-purpose CRC calculation circuit which has a small area and is compatible with a self-diagnosis circuit.

(First Embodiment)

Figure 3:
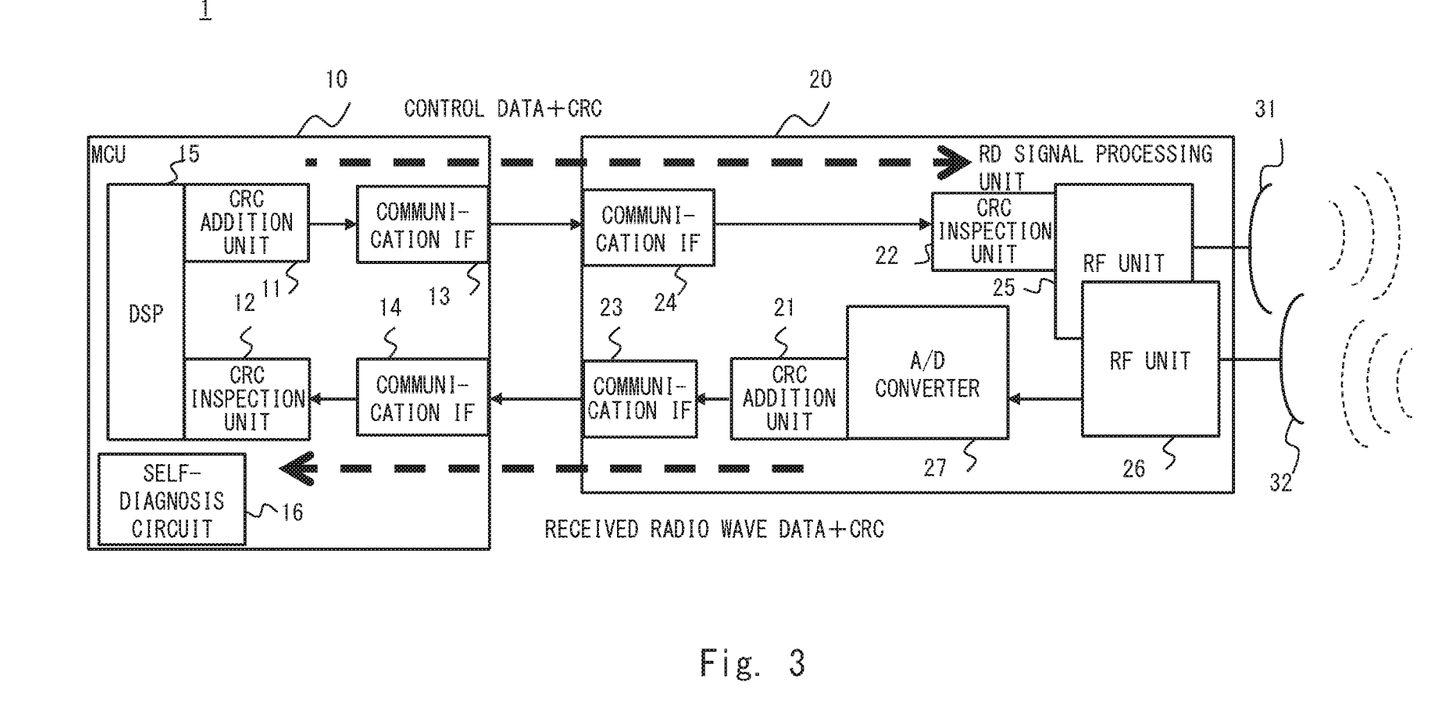
FIG. 3 is a block diagram showing a configuration example of an on-vehicle radar system according to a first embodiment.

A first embodiment will be described below with reference to the drawings. FIG. 3 shows a configuration example of an on-vehicle radar system according to the first embodiment. While the on-vehicle radar system is illustrated by way of example in this embodiment, the CRC calculation circuit according to the embodiment described below may be applied to other systems and semiconductor devices which incorporate a CRC system.

As shown in FIG. 3, an on-vehicle radar system 1 according to the first embodiment includes an MCU (microcontroller) 10, an RF signal processing unit 20, a transmission antenna 31, and a reception antenna 32. The MCU 10 and the RF signal processing unit 20 are separate semiconductor devices (semiconductor chips), The MCU 10 and the RF signal processing unit 20 are connected in such a manner that the MCU 10 and the RF signal processing unit 20 can communicate with each other by a serial interface or the like. The transmission antenna 31 and the reception antenna 32 are radar antennas, and are incorporated in, for example, an emblem of a vehicle body.

The MCU 10 is a control unit that controls the operation of the RF signal processing unit 20, For example, the MCU 10 detects an object based on radio waves transmitted or received by the RF signal processing unit 20. The MCU 10 includes a CRC addition unit 11, a CRC inspection unit 12, a communication IF (interface) 13, a communication IF 14, a DSP 15, and a self-diagnosis circuit 16.

The CRC addition unit 11 generates a CRC code based on control data generated by the DSP 15, and adds the generated CRC code to the control data. The communication IF 13 is an interface for transmitting the control data, and transmits the control data and the CRC code f rom the CRC addition unit 11 to the RF signal processing unit 20.

The communication IF 14 is an interface for receiving received radio wave data, and receives the received radio wave data and the CRC code from the RF signal processing unit 20. The CRC inspection unit 12 generates a CRC code based on the received radio wave data received by the communication IF 14, and performs a CRC inspection (data error detection) based on the generated CRC code and the received CRC code.

The DSP 15 generates control data for controlling the transmission of the radio wave from, the RF signal processing unit 20, and performs processing for detecting an object based on the received radio wave data received from the RF signal processing unit 20. The DSP 15 includes a generation unit that generates control data, and an object detection unit, that detects an object. The self-diagnosis circuit 16 executes self-diagnosis processing for each circuit in the MCU 10 at the time of startup of the MCU 10. Specifically, the self-diagnosis circuit 16 conducts a scan test on a scan path that connects flip-flops of each circuit.

The RF signal processing unit. 20 transmits and receives radio waves based on control of the MCU 10. The RF signal processing unit 20 includes a CRC addition unit 21, a CRC inspection unit 22, a communication IF 23, a communication IF 24, an RF unit 25, an RF unit 26, and an A/D converter 27.

The communication IF 24 is an interface for receiving the control data, and receives the control data and the CRC code from the MCU 10. The CRC inspection unit 22 generates a CRC code based on the control data received by the communication IF 24, and performs a CRC inspection based on the generated CRC code and the received CRC code. The RF unit 25 generates an RF signal according to the received control data, and transmits the radio wave from the transmission antenna 31 using the generated RF signal.

The RF unit 26 generates an RF signal based on the radio wave received by the reception antenna 32. The A/D converter 27 converts the received RF signal into a digital signal (received radio wave data). The CRC addition unit 21 generates a CRC code based on the received radio wave data generated by the A/D converter 27, and adds the generated CRC code to the received radio wave data. The communication IF 23 is an interface for transmitting the received radio wave data, and transmits the received radio wave data and the CRC code from the CRC addition unit 21 to the MCU 10.

In the object detection operation by the radar in the on-vehicle radar system 1, the RF unit 26 first processes the radio wave from the reception antenna 32, and the A/D converter 27 converts the received radio wave data. At this time, the CRC addition unit 21 adds the CRC code to the received radio wave data and transmits the received radio wave data to the MCU 10 via the communication IF 23, The received radio wave data to which the CRC code is added is communicated (transferred) via an interface.

In the MCU 10, the CRC inspection unit 12 that inspects the CRC code checks that the data is not damaged during the communication of the received radio wave data. Since the data is protected by the CRC code from the beginning to the end of the communication, the safety of communication data is guaranteed. The MCU 10 performs processing for the received radio wave data (radar data), and control data for the next radio wave radiation is transmitted to the RF signal processing unit 20. At this time, the CRC addition unit 11 adds the CRC code to the transmission data (set data). The RF signal processing unit 20 which receives the data performs calculation of the CRC code. When it is confirmed that the data has no problem, the next radio wave in which setting information is reflected is irradiated.

Figure 4:
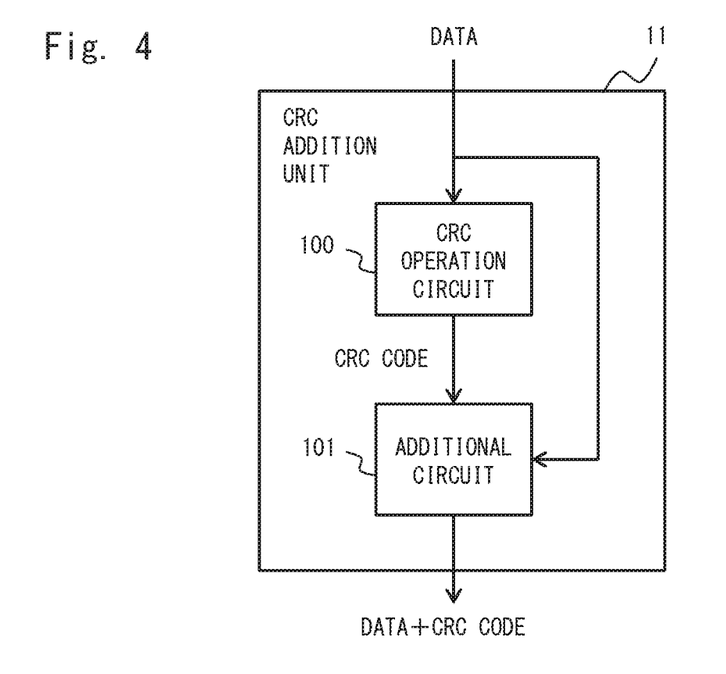
FIG. 4 is a block diagram showing a configuration example of a CRC addition unit according to the first embodiment.

FIG. 4 shows a configuration example of the CRC addition unit 11 in the MCU 10. Note that the CRC addition unit 21 in the RF signal processing unit 20 can be configured with the same circuit as that of the CRC addition unit 11.

As shown in FIG. 4, the CRC addition unit 11 includes a CRC calculation circuit 100 and an additional circuit 101. The CRC calculation circuit 100 performs CRC calculation on input data (control data or the like) using a preliminarily set generator polynomial, and generates a CRC code as a calculation result. The additional circuit 101 adds the generated CRC code to the input data and outputs the data.

Figure 5:
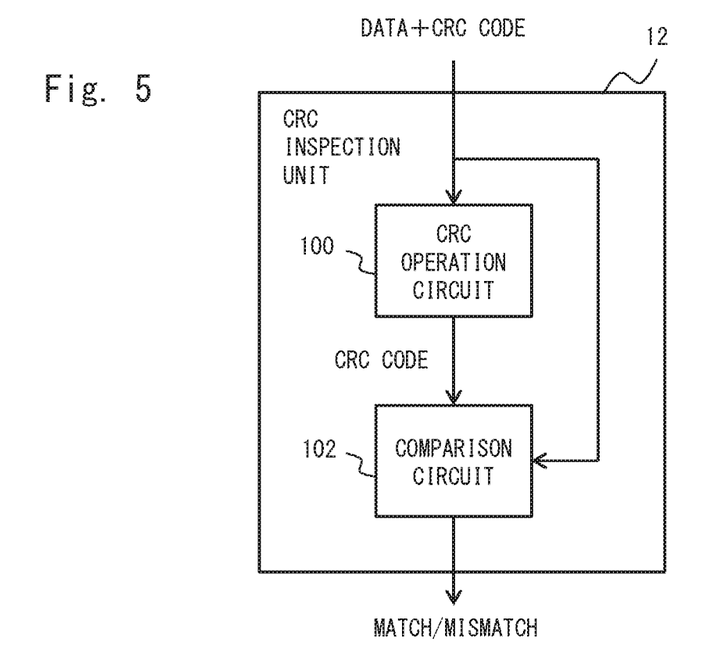
FIG. 5 is a block diagram showing a configuration example of a CRC inspection unit according to the first embodiment.

FIG. 5 shows a configuration example of the CRC inspection unit 12 in the MCU 10. Note that the CRC inspection unit 22 in the RF signal processing unit 20 can be configured with the same circuit as that of the CRC inspection unit 12.

As shown in FIG. 5, the CRC inspection unit 12 includes the CRC calculation circuit 100 and a comparison circuit 102. The CRC calculation circuit 100 is a circuit having the same configuration as the CRC addition unit 11 shown in FIG. 4, performs CRC calculation on the input data (received radio wave data etc.) by using a preliminarily set generator polynomial, and generates a CRC code as a calculation result. The comparison circuit 102 compares the generated CRC code with the CRC code which is added to the input data, and outputs a match or a mismatch as a result of the CRC inspection. Other configurations may be used as long as the CRC inspection can be performed. For example, the CRC calculation may be performed on data including the CRC code, and the result of the CRC calculation may be output.

Figure 6:
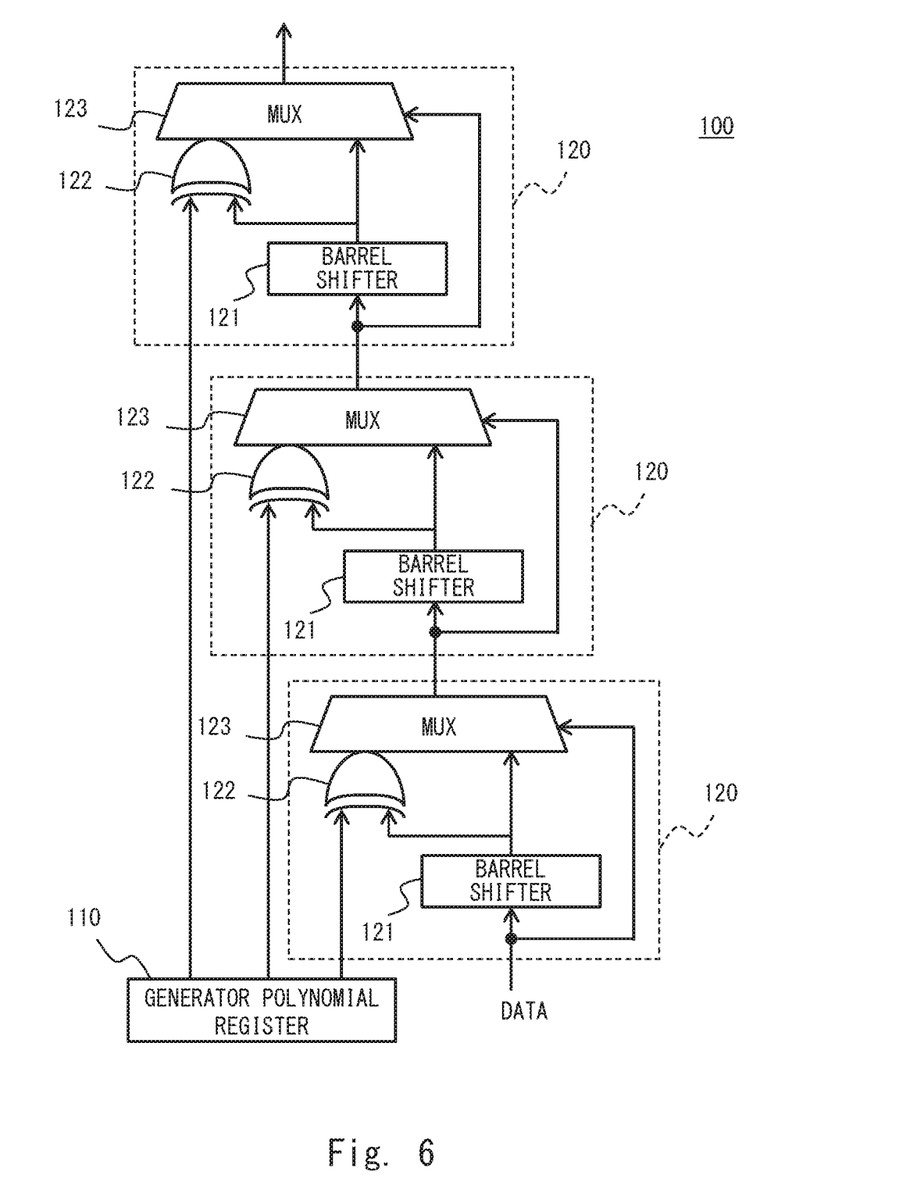
FIG. 6 is a block diagram showing a principal configuration example of the CRC calculation circuit according to the first embodiment.

FIG. 6 shows a principal configuration of the CRC calculation circuit 100 according to the first embodiment shown in FIGS. 4 and 5. As shown in FIG. 6, the CRC calculation circuit 100 mainly includes a generator polynomial register 110 and a plurality of CRC calculation units 120. The generator polynomial register (generator polynomial storage unit) 110 stores polynomial data corresponding to a generator polynomial. The CRC calculation units 120 performs CRC calculation using the generator polynomial (polynomial data) while shifting bits of input data. The CRC calculation units 120 are connected in series and provided so as to correspond to the number of bits of the input data to be calculated.

The CRC calculation units 120 each include a barrel shifter 121, an XOR circuit 122, and a multiplexer 123. The barrel shifter 121 shifts calculated data by one bit using the input data or output data from the pre-stage CRC calculation unit 120 as the calculated data. For example, one bit is shifted toward the least significant bit (shifted rightward). However, one bit may be shifted toward the most significant bit (shifted leftward). The barrel shifter 121 is a logic circuit that shifts bits of data by switching the input bit. position and the output bit position.

The XOR circuit 122 is a logic circuit that performs XOR calculation of the shifted data, which is shifted by the barrel shifter 121, and the polynomial data in the generator polynomial register 110. The multiplexer (selection circuit.) 123 is a logic circuit that selects, based on calculated data (unshifted data), one of the shifted data shifted by the barrel shifter 121 and calculation result data obtained as a result of calculation by the XOR circuit 122, The multiplexer 123 may select the shifted data or calculation result data based on the least significant bit or the most significant bit of the calculated data. For example, when the least significant bit or the most significant bit of the calculated data is "1", the multiplexer 123 may select the calculation result data, and when the least significant bit or the most significant bit of the calculated data is "0", the multiplexer 123 may select the shifted data, In other words, the multiplexer 123 may select one of the shifted data and the calculation result data based on the bit (e.g., the least significant, bit or the most, significant bit) at an end in a shift direction (a right shift direction or a left shift, direction) of the barrel shifter among the bits of the calculated data. When the bit at the end in the shift direction is "1", the multiplexer 123 may select the calculation result data, and when the bit at the end in the shift direction is "0", the multiplexer 123 may select, the shifted data. Selection of the XOR calculation based on the least significant bit or the most significant bit of the calculated data or the bit at an end in the shift direction makes it possible to implement the CRC calculation using a logic circuit.

Figure 7A:
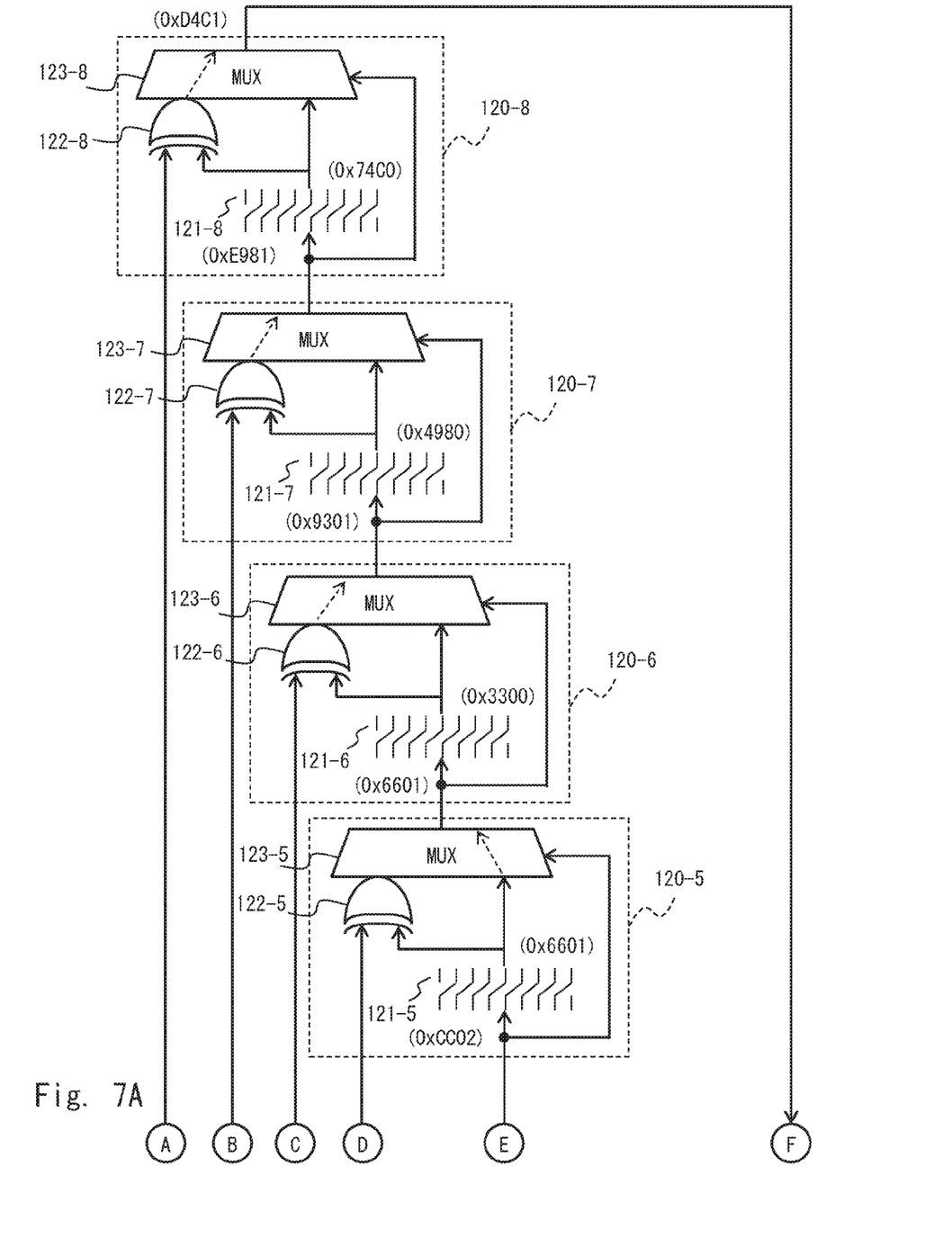
FIG. 7A is a block diagram showing a specific configuration example of the CRC calculation circuit according to the first embodiment.
Figure 7B:
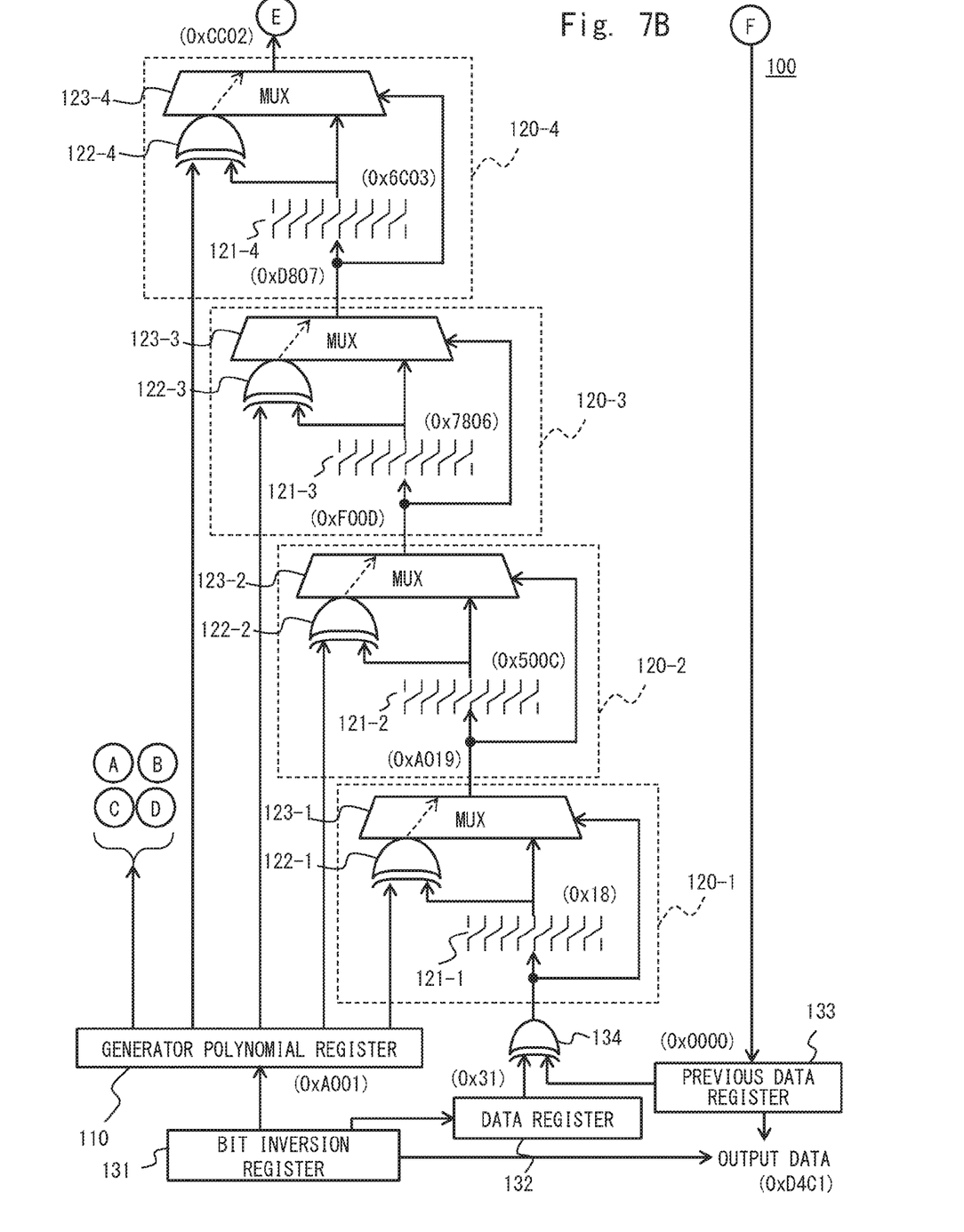
FIG. 7B is a block diagram showing a specific configuration example of the CRC calculation circuit according to the first embodiment.

FIGS. 7A and 7B show specific examples of the CRC calculation circuit 100 that performs CRC calculation on 1-byte (8-bit) data. In the examples shown in FIGS. 7A and 7B, the CRC calculation circuit 100 includes the generator polynomial register 110 and eight stages of CRC calculation units 120-1 to 120-8 respectively corresponding to eight bits.

Further, the CRC calculation circuit 100 includes a bit inversion (shift and reverse setting) register 131, a data register 132, a previous data register (initial value or previous value register) 133, and an XOR circuit 134. In the CRC calculation circuit 100, the components other than the registers 110 and 131 to 133, which are configured using flip-flops, are configured using a combinational logic circuit.

The bit inversion register 131 sets a bit inversion for the polynomial data stored in the generator polynomial register 110, the input data input to the data register 132, and the output data output from the previous data register 133. The term "bit inversion" refers to changing (bit swapping) a sequence of bits between the MSB (Most Significant Bit) and the LSB (Least Significant Bit).

The bit inversion register 131 stores a setting as to whether a bit inversion in units of generator polynomials and output data is present or not, and a setting as to whether a bit inversion in units of bytes of input data is present or not. For example, a bit inversion circuit that inverts bits of each piece of data according to the setting of the bit inversion stored in the bit inversion register 131 may be provided. The bit inversion register 131 or the bit inversion circuit may constitute a bit inversion unit.

When a bit inversion for a generator polynomial is present, the bit inversion register 131 (or the bit inversion circuit) inverts the bits of the entire polynomial data in the generator polynomial register 110. Specifically, the bit sequence from the MSB to the LSB of the polynomial data is inverted. For example, in FIG. 7B, when the generator polynomial has a 16-bit width and indicates "0x8005", the bits of the entire data are inverted to "0xA001". Further, when the maximum data processing width of the generator polynomial register 110 is 64-bit data, the bits of the data (64-bit data) may be inverted once and then 16 bits for actual use may be shifted toward the LSB. For example, the entire data "0x0000000000008005" is inverted to "0xA001000000000000", and "0xA001" is shifted toward the LSB to thereby obtain "0x000000000000A001". In this case, if all unused bits (bits higher than the 16th bit) are set to "0", the bits have no adverse effect on the processing.

When a bit inversion for the input data is present, the bit inversion register 131 (or the bit inversion circuit) inverts the bits of the input data in the data register 132 in units of bytes. Specifically, the input data is divided into byte units, and a sequence of bits from the MSB to the LSB in each byte is inverted. The inversion of bits in units of bytes can prevent the address of the input data from being different from the original address.

For example, when the input data indicates "0x12345678", the first byte "0x12" is inverted to "0x48"; the second byte "0x34" is inverted to "0x2C"; the third byte "0x56" is inverted to "0x6A"; and the fourth byte "0x78" is inverted to "0x1E". As a result, the bits of the input data "0x12345678" are inverted to "0x482C6A1E", In FIG. 716, the input data obtained after the bit inversion is "0x31".

As shown in FIG. 716, the CRC calculation units 120-1 to 120-8 perform CRC calculation on the input data "0x31" in the data register 132 by using the polynomial data "0xA001" in the generator polynomial register 110. The XOR circuit 134 for adding (taking XOR) the previous calculation result is connected to a node between the data register 132 and the CRC calculation unit 120-1. In FIG. 7B, the XOR circuit 134 performs XOR calculation of the input data "0x31" and the initial value "0x0000" in the previous data register 133, and outputs the calculated data "0x31" to the CRC calculation unit 120-1.

In the CRC calculation unit 120-1, the barrel shifter 121-1 shifts the data "0x31", which is received from the XOR circuit 134, rightward by one bit, and generates shifted data "0x18". Since the LSB of the input data "0x31" is "1", the multiplexer 123-1 selects the output from, the XOR circuit. 122-1. Specifically, the XOR circuit 122-1 performs XOR calculation of the polynomial data "0xA001" and the shifted, data "0x18", and the multiplexer 123-1 outputs the calculated data "0xA019" to the CRC calculation unit 120-2.

In the CRC calculation unit. 12 0-2, the barrel shifter 121-2 shifts the data "0xA019", which is received from the CRC calculation unit 120-1, rightward by one bit, and generates shifted data "0x500C". Since the LSB of the input data "0xA019" is "1", the multiplexer 123-2 selects the output from the XOR circuit. 12 2-2. Specifically, the XOR circuit 122-2 performs XOR calculation of the polynomial data "0xA001" and the shifted data "0x500C", and the multiplexer 123-2 outputs the calculated data "0xF00D" to the CRC calculation unit 120-3.

In the CRC calculation unit 120-3, the barrel shifter 121-3 shifts the data "0xF00D", which is received from the CRC calculation unit 120-2, rightward by one bit, and generates shifted data "0x7806". Since the LSB of the input data "0xF00D" is "1", the multiplexer 123-3 selects the output from the XOR circuit 122-3. Specifically, the XOR circuit 122-3 performs XOR calculation of the polynomial data "0xA001" and the shifted data "0x7806", and the multiplexer 123-3 outputs the calculated data "0xD807" to the CRC calculation unit 120-4.

In the CRC calculation unit 120-4, the barrel shifter 121-4 shifts the data "0xD807", which is received from the CRC calculation unit 120-3, rightward by one bit, and generates shifted data "0x6C03". Since the LSB of the input data "0xD807" is "1", the multiplexer 123-4 selects the output from the XOR circuit 122-4, Specifically, the XOR circuit 122-4 performs XOR calculation of the polynomial data "0xA001" and the shifted data "0x6C03", and the multiplexer 123-4 outputs the calculated data "0xCC02" to the CRC calculation unit 120-5.

As shown in FIG. 7A, in the CRC calculation unit 120-5, the barrel shifter 121-5 shifts the data "0xCC02", which is received from the CRC calculation unit 120-4, rightward by one bit, and generates shifted data "0x6601". Since the LSB of the input data "0xCC02" is "0", the multiplexer 123-5 does not select the output from the XOR circuit 122-5 (selects the output from the barrel shifter 121-5). Specifically, the multiplexer 123-5 outputs the shifted data "0x6601" to the CRC calculation unit 120-6.

In the CRC calculation unit 120-6, the barrel shifter 121-6 shifts the data "0x6601", which is received from the CRC calculation unit 120-5, rightward by one bit, and generates shifted data "0x3300". Since the LSB of the input data "0x6601" is "1", the multiplexer 123-6 selects the output from the XOR circuit 122-6. Specifically, the XOR circuit 122-6 performs XOR calculation of the polynomial data "0xA001" and the shifted data "0x3300" and the multiplexer 123-6 outputs the calculated data "0x9301" to the CRC calculation unit 120-7.

In the CRC calculation unit 120-7, the barrel shifter 121-7 shifts the data "0x9301", which is received from the CRC calculation unit 120-6, rightward by one bit, and generates shifted data "0x4980". Since the LSB of the input data "0x9301" is "1", the multiplexer 123-7 selects the output from the XOR circuit 122-7. Specifically, the XOR circuit 122-7 performs XOR calculation of the polynomial data "0xA001" and the shifted data "0x4980", and the multiplexer 123-7 outputs the calculated data "0xE981" to the CRC calculation unit 120-8.

In the CRC calculation unit 120-8, the barrel shifter 121-8 shifts, the data "0xE981", which is received from the CRC calculation unit 120-7, rightward by one bit, and generates shifted data "0x74C0". Since the LSB of the data "0xE981" is "1", the multiplexer 123-8 selects the output from the XOR circuit 122-8, Specifically, the XOR circuit 122-8 performs XOR calculation of the polynomial data "0xA001" and the shifted data "0x74C0", and the multiplexer 123-8 outputs the calculated data "0xD4C1" to the previous data register 133.

When the CRC calculation by the operation of the CRC calculation units 120-1 to 120-8 described above is finished, the data "0xD4C1" in the previous data register 133 is output as output data as shown in FIG. 7B. During the output, the bit inversion is performed according to the setting of the bit inversion register 131 in the same manner as that for generator polynomials.

The input data subjected to the CRC calculation is input in units of one byte (eight bits), which allows the eight stages of the CRC calculation units 120-1 to 120-8 to perform calculation processing in units of input data, When the data to be calculated is 1-byte (8-bit) data, the processing of the CRC calculation units 120-1 to 120-8 is executed once and the calculation is finished. When the data is 2-byte (16-bit: one word) data, the processing of the CRC calculation units 120-1 to 120-8 is executed twice and the calculation is finished. When the data is 4-byte (32-bit: one long word) data, the processing of the CRC calculation units 120-1 to 120-8 is executed four times and the calculation is finished. The calculation is repeatedly executed depending on the data size, so that the eight stages of the CRC calculation units 120-1 to 120-8 can perform the calculation processing on data of various sizes.

As shown in FIG. 6 and FIGS. 7A and 7B, in this embodiment, the multiplexer is configured to be able to select the XOR logical calculation using a generator polynomial (POLY) based on the data (pre-stage calculation result) input in each CRC calculation unit. CRC code calculation algorithms include a left shift system and a right shift system. To implement the calculation in the same circuit, the configurations of the multiplexer and the XOR circuit part (CRC calculation unit) can be shared by performing a bit inversion setting for input data and polynomial data corresponding to a generator polynomial.

In the configuration of this embodiment, the flip-flop part in the related look-up table system can be configured using a combinational circuit. Accordingly, generator polynomials can be switched in one cycle. In this embodiment, the number of flip-flops to be used is required for setting an input data width (8-bit), a polynomial data width (64-bit), and a partial set data width. Only these flip-flops output the final data.

On the other hand, in the look-up table system, the number of flip-flops for holding intermediate data is associated with the output data. Like in the look-up table system, in the configuration in which a large number of flip-flops output data, the probability of obtaining a desired combination as a final output in a SCAN test using a random number is extremely low, which makes it difficult to detect a failure. In this embodiment, only a small number of flip-flops are used, and thus the failure detection in the SCAN test can be performed with a simple configuration. For example, startup diagnosis used for semiconductor for general automobiles is required to be performed with a high detection rate for a short period of time. Accordingly, the configuration of this embodiment that facilitates the failure detection is suitable for on-vehicle products.

As described above, according to this embodiment, in each CRC calculation unit, the barrel shifter shifts the input data (pre-stage calculation result) and the XOR logical calculation of the shifted data and the polynomial data can be selected based on the input data, thereby making it possible to deal with various types of generator polynomials with a simple configuration. Unlike the related look-up table system, this embodiment includes no data storage unit and a function similar to the data storage unit can be implemented only by a logical calculation. Accordingly, the number of flip-flops that affect the output of the CRC code can be reduced. Therefore, the configuration that can be used for general purposes and facilitates the failure detection is achieved, and the configuration is suitable for on-vehicle CRC calculation. Further, when polynomials are changed, there is no need to change the look-up table, and thus the generator polynomials can be switched rapidly. Furthermore, in the configuration, a small number of flip-flops are used, which prevents an increase in the circuit area.

(Second Embodiment)

Figure 8:
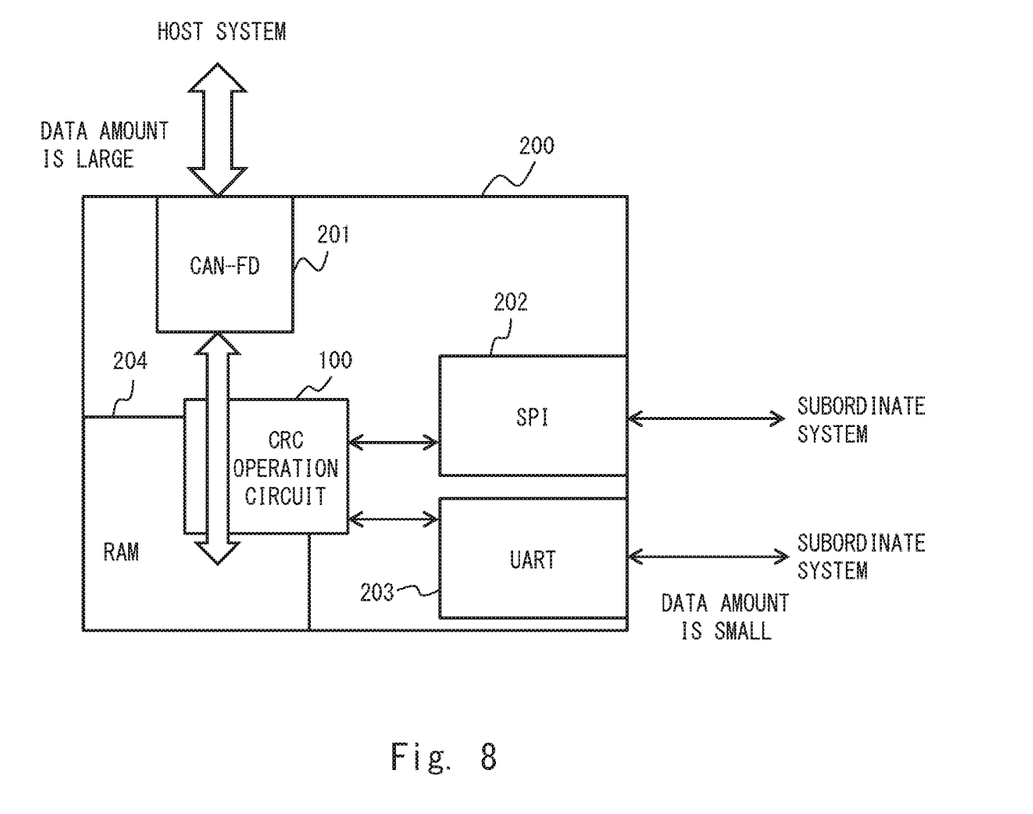
FIG. 8 is a block diagram showing a configuration example of a control unit according to a second embodiment.

A second embodiment will be described below with reference to the drawings. FIG. 8 shows a configuration example of a control unit according to the second embodiment. This example is an example in which a CRC calculation circuit according to an embodiment is applied to a control unit (communication system) including a plurality of communication interfaces.

As shown in FIG. 8, a control unit 200 according to the second embodiment is, for example, a control unit for an on-vehicle, and includes the CRC calculation circuit 100 of the first embodiment, a CAN-FD interface 201, an SPI interface 202, a UART interface 203, and a RAM 204. The CAN-FD interface 201 is connected to a host system via a CAN-FD network. The SPI interface 202 is connected to a subordinate system via an SPI bus. The UART interface 203 is connected to a subordinate system via a UART serial bus.

In the CRC calculation circuit 100, as described in the first embodiment, only one cycle is required to switch the generator polynomials, and thus rapid switching can be achieved. The use of this feature makes it possible to provide the following operation and advantageous effects in this embodiment.

In this case, a system for transferring information transmitted from a host system (CAN-FD) to a subordinate system is considered assuming that the information from the host system is a relatively large amount of data. As a generator polynomial of a CRC code, a generator polynomial with a large number of bits is generally used for large data. An efficient generator polynomial to deal with supposed data corruption is determined depending on each interface. Accordingly, the generator polynomials are changed depending on the amount of data and the feature of the communication IF.

For example, the CRC calculation circuit 100 performs CRC calculation using a generator polynomial with a large number of bits for large data from the host system, and stores the calculation result in the RAM 204. When the data of the RAM 204 is used for transfer of information to the subordinate system, the CRC calculation circuit 100 performs CRC calculation using a generator polynomial with a small number of bits and performs communication. Thus, since polynomials can be switched rapidly in this embodiment, a calculation corresponding to a plurality of communications can be rapidly performed in one calculation module by switching polynomials depending on the amount of data and the interface.

The invention made by the present .inventor has been described in detail above based on embodiments. However, the present invention is not limited to the above embodiments and can be modified in various ways without departing from the gist of the invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first and second embodiments can be combined as desirable by one of ordinary skill in the art.

What is claimed is:

1. A CRC calculation circuit comprising:
 a generator polynomial storage unit configured to store polynomial data corresponding to a generator polynomial; and
 a plurality of CRC calculation units connected in series and provided so as to correspond to the number of bits of input data to be calculated, wherein
 the plurality of CRC calculation units each include:
  a barrel shifter configured to shift calculated data by one bit using one of the input data and output data from a pre-stage CRC calculation unit as the calculated data;
  an XOR circuit configured to perform XOR calculation of shifted data and the polynomial data, the shifted data being shifted by the barrel shifter; and
  a selection circuit configured to select, based on the calculated data, one of the shifted data and calculation result data obtained as a result of calculation by the XOR circuit and output the selected data.

2. The CRC calculation circuit according to claim 1, wherein the selection circuit selects data to be output based on one of a least significant bit and a most significant bit of the calculated data.

3. The CRC calculation circuit according to claim 2, wherein the selection circuit selects the calculation result data when one of the least significant bit and the most significant bit of the calculated data is "1", and the selection circuit selects the shifted data when one of the least significant bit and the most significant bit is "0".

4. The CRC calculation circuit according to claim 1, wherein the selection circuit selects data to be output based on a bit at an end in a shift direction of the barrel shift among the bits of the calculated data.

5. The CRC calculation circuit according to claim 4, wherein the selection circuit selects the calculation result data when the bit at the end in the shift direction is "1", and the selection circuit selects the shifted data when the bit at the end in the shift direction is "0".

6. The CRC calculation circuit according to claim 1, further comprising a bit inversion unit configured to invert a bit sequence of the polynomial data.

7. The CRC calculation circuit according to claim 6, wherein the bit inversion unit inverts a bit sequence from a least significant bit to a most significant bit of the polynomial data.

8. The CRC calculation circuit according to claim 6, wherein the bit inversion unit inverts bits of output data by the same inversion method as that for the polynomial data, the output data being finally obtained from the plurality of CRC calculation units.

9. The CRC calculation circuit according to claim 1, further comprising a bit inversion unit configured to invert a bit sequence of the input data.

10. The CRC calculation circuit according to claim 9, wherein the bit inversion unit divides the input data into byte units and inverts a bit sequence from a least significant bit to a most significant bit in each byte.

11. The CRC calculation circuit according to claim 1, wherein
 the CRC calculation units each receive the input data in units of eight bits, and
 the CRC calculation circuit includes eight stages of the calculation units.

12. The CRC calculation circuit according to claim 11, wherein when the input data is 16-bit data, the eight stages of the CRC calculation units repeat a calculation twice.

13. The CRC calculation circuit according to claim 11, wherein when the input data is 32-bit data, the eight stages of the CRC calculation units repeat a calculation four times.

14. The CRC calculation circuit according to claim 1,
 wherein the plurality of CRC calculation units comprise a first CRC calculation unit and a second CRC calculation unit,
 wherein the first CRC calculation unit comprises a first barrel shifter, a first XOR circuit and a first selection circuit,
 wherein the second CRC calculation unit comprises a second barrel shifter, a second XOR circuit and a second selection circuit,
 wherein the first CRC calculation unit is further configured to shift the input data by one bit by the first barrel shifter, to pass the input data shifted by one bit from the first barrel shifter to the first selection circuit, to process the polynomial data together with the input data, shifted by the first barrel shifter, by the first XOR circuit and to select a first selected data, by the first selection circuit, from the input data and the input data, shifted by the first barrel shifter, based on an output of the first XOR circuit,
 wherein the first CRC calculation unit is further configured to output a selected data, from the first selection circuit, to the second barrel shifter,
 wherein the second CRC calculation unit is further configured to shift the selected data by one bit by the second barrel shifter, to pass the selected data shifted by one bit from the second barrel shifter to the second selection circuit, to process the polynomial data together with the selected data, shifted by the second barrel shifter, by the second XOR circuit and to select a second selected data, by the second selection circuit, from the selected data and the selected data, shifted by the second barrel shifter, based on an output of the second XOR circuit.

15. A semiconductor device comprising:
 a CRC addition unit including a CRC calculation circuit and configured to add a CRC code to transmission data, the CRC code being a calculation result of the CRC calculation circuit; and a CRC inspection unit including the CRC calculation circuit and configured to detect an error in reception data based on the CRC code as the calculation result of the CRC calculation circuit, wherein the CRC calculation circuit includes:
- a generator polynomial storage unit configured to store polynomial data corresponding to a generator polynomial;
- a plurality of CRC calculation units connected in series and provided so as to correspond to the number of bits of input data to be calculated, and
- the plurality of CRC calculation units each include:
  - a barrel shifter configured to shift calculated data by one bit using one of the input data and output data from a pre-stage CRC calculation unit as the calculated data;
  - an XOR circuit configured to perform XOR calculation of shifted data and the polynomial data, the shifted data being shifted by the barrel shifter; and
  - a selection circuit configured to select, based on the calculated data, one of the shifted data and calculation result data obtained as a result of calculation by the XOR circuit and output the selected data.

16. A radar system comprising:
- a radio wave transmission/reception unit configured to transmit and receive a radio wave; and
- a control unit configured to control the radio wave transmission/reception unit, wherein the control unit includes:
- a control data generation unit configured to generate control data for controlling transmission of the radio wave of the radio wave transmission/reception unit;
- a CRC addition unit including a CRC calculation circuit and configured to add a CRC code to the control data, the CRC code being a calculation result of the CRC calculation circuit;
- a transmission unit configured to transmit, to the radio wave transmission/reception unit, the control data to which the CRC code is added;
- a reception unit configured to receive, from the radio wave transmission/reception unit, the CRC code and received radio wave data indicating the radio wave received by the radio wave transmission/reception unit;
- a CRC inspection unit including the CRC calculation circuit and configured to check an error in the received radio wave data based on the received CRC code and the CRC code as the calculation result of the CRC calculation circuit; and
- an object detection unit configured to detect an object based on the received radio wave data with no error, the CRC calculation circuit includes:
- a generator polynomial storage unit configured to store polynomial data corresponding to a generator polynomial; and
- a plurality of CRC calculation units connected in series and provided so as to correspond to the number of bits of input data to be calculated, and the plurality of CRC calculation units each include:
- a barrel shifter configured to shift calculated data by one bit using one of the input data and output data from a pre-stage CRC calculation unit as the calculated data;
- an XOR circuit configured to perform XOR calculation of shifted data and the polynomial data, the shifted data being shifted by the barrel shifter; and
- a selection circuit configured to select, based on the calculated data, one of the shifted data and calculation result data obtained as a result of calculation by the XOR circuit and output the selected data.

* * * * *